(12) United States Patent
Imam et al.

(10) Patent No.: US 6,867,083 B2
(45) Date of Patent: Mar. 15, 2005

(54) METHOD OF FORMING A BODY CONTACT OF A TRANSISTOR AND STRUCTURE THEREFOR

(75) Inventors: Mohamed Imam, Tempe, AZ (US); Jefferson W. Hall, Phoenix, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 10/426,515

(22) Filed: May 1, 2003

(65) Prior Publication Data

US 2004/0217418 A1 Nov. 4, 2004

(51) Int. Cl.[7] .................. H01L 21/8238; H01L 21/336; H01L 29/76; H01L 29/94; H01L 31/062
(52) U.S. Cl. .................... 438/212; 438/259; 438/270; 438/271; 438/587; 438/588; 438/589; 257/142; 257/341; 257/342; 257/329; 257/330; 257/331; 257/343
(58) Field of Search .................. 257/341, 342, 257/329, 330, 331, 343, 142; 438/212, 259, 270, 271, 589, 588, 587

(56) References Cited

U.S. PATENT DOCUMENTS

| 4,639,754 A | * | 1/1987 | Wheatley et al. ........... 257/142 |
| 5,034,785 A |   | 7/1991 | Blanchard |
| 5,866,931 A |   | 2/1999 | Buluca et al. |
| 6,204,533 B1 |   | 3/2001 | Williams et al. |
| 6,541,818 B2 | * | 4/2003 | Pfirsch et al. ............... 257/331 |
| 6,566,710 B1 | * | 5/2003 | Strachan et al. ............ 257/341 |

* cited by examiner

*Primary Examiner*—Steven Loke
(74) *Attorney, Agent, or Firm*—Robert F. Hightower

(57) ABSTRACT

A transistor (10, 30, 60) is formed to have a body contact (16, 36, 69) that has a minimal contact to the sides of the source region (14, 34, 63). This increases the density and reduces on-resistance of the transistor (10, 30, 60).

19 Claims, 10 Drawing Sheets

METHOD OF FORMING A BODY CONTACT OF A TRANSISTOR AND STRUCTURE THEREFOR

BACKGROUND OF THE INVENTION

The present invention relates, in general, to electronics, and more particularly, to methods of forming semiconductor devices and structure.

In the past, the semiconductor industry utilized various methods to provide high density semiconductor devices and particularly high density transistor structures. The source region of some transistors was produced as a long narrow stripe. One such stripe transistor structure is disclosed in U.S. Pat. No. 6,204,533 issued to Williams et al on Mar. 20, 2001, which is hereby incorporated herein by reference. FIG. 1 illustrates in a general way some of the elements of one example of a prior art stripe transistor 100. Transistors implemented as a stripe structure typically had a body contact diffusion region or body contact formed within a source region. The body contact extended through the source region to make electrical contact to a body region 106. The source region had a physical length 102 that extended along the stripe and a physical width 104. The body contact occupied an area of the source region and had a width 105. The body contact was positioned a distance 103 from the edge of the gate insulator to silicon interface of the transistor in order to prevent the body contact from creating an inactive area along the source region stripe. Distance 103 allowed current to flow through the portion of the source region that was between the gate and the body contact when transistor 100 was enabled. Distance 103 typically was large enough to ensure that some of the source region was always between the body contact and the gate even if there was misalignment during the manufacturing process. Thus, the minimum value of distance 103 typically was at least about one-half of the value of the minimum resolvable dimension of the photolithography techniques used to manufacture transistor 100. As a result, the minimum value of width 104 was about two times the minimum resolvable dimension. This large width reduced the density of the transistor, increased source resistance, and increased the manufacturing cost. Another important parameter of the transistor was the body region resistance or body resistance. Distance 103 increased the body resistance and the corresponding value of the voltage in the body region or body voltage of transistor 100. The increased body resistance and corresponding body voltage reduced the latch-up immunity of transistor 100.

FIG. 2 illustrates in a general way some of the features of an embodiment of another prior art stripe transistor 170. Transistor 170 was a lateral transistor that had a source region 171 positioned within a body region of transistor 170. Source region 171 had a physical width 178. A gate 174 was interposed between source region 171 and drain regions 172. Body contacts 173 were positioned within each source region 171 to electrically contact the body region. Each body contact 173 was spaced a distance 177 from each gate 174. Distance 177 was similar to distance 103 in FIG. 1. A metal contact area 176, illustrated by a dashed line, extended along the surface of region 171 in order to make electrical contact to source region 171 and body contacts 173. Body contacts 173 were positioned within region 171 as a diamond shape relative to the orientation of the sides of source region 171. The diamond shape provided a high probability of forming good electrical contact to source region 171 and body contact 173 even when contact area 176 was misaligned to body contacts 173. However, the dimension of contact 173 parallel to the edge of the gate was reduced and the source edge along the contact area increased correspondingly, thereby decreasing effective source resistance. The increased body resistance and corresponding body voltage reduced the latch-up immunity of transistor 170. However, distance 177 typically was the same as distance 103 that was illustrated in FIG. 1, and the minimum value of width 178 typically remained at least about two times the minimum resolvable dimension. Although source resistance decreased, this large width reduced the density of transistor 170, increased the manufacturing cost, and maintained increased body resistance and susceptibility to latch-up.

Some other transistors were formed as a number of square cells with the source region within the square and the body contact within the source region. One example of such a transistor structure is disclosed in U.S. Pat. No. 5,034,785 issued to Richard Blanchard on Jul. 23, 1991, which is hereby incorporated herein by reference. FIG. 3 illustrates in a general way some of the elements of an example of a square cell transistor 150. Each body contact had a width 151 that typically had a value of the minimum resolvable dimension of the photolithography process. Each side of the body contact was spaced away from the gate by a distance 152 in order to prevent forming an inactive area in the source region and to ensure that the source region and the channel region could support the desired current flow of transistor 150. Typically, the minimum value of distance 152 was about one-half of distance 151. The total width 153 of the source region was a distance equal to width 151 plus two times distance 152, which typically was a distance of about two times the minimum resolvable dimension, thus, the minimum source area was about four times the minimum resolvable dimension. This large cell size resulted in a low density which increased manufacturing costs. Distance 152 also increased the body resistance and corresponding body voltage of transistor 150. The increased body resistance and corresponding body voltage reduced the latch-up immunity of transistor 150.

Accordingly, it is desirable to have a transistor structure that has a small area, a low body resistance, a high latch-up immunity, and a high packing density.

BRIEF DESCRIPTION OF THE DRAWINGS

For simplicity and clarity of illustration, elements in the figures are not necessarily to scale, and the same reference numbers in different figures denote the same elements. Additionally, descriptions and details of well-known steps and elements are omitted for simplicity of the description.

DETAILED DESCRIPTION OF THE DRAWINGS

Figure 4:
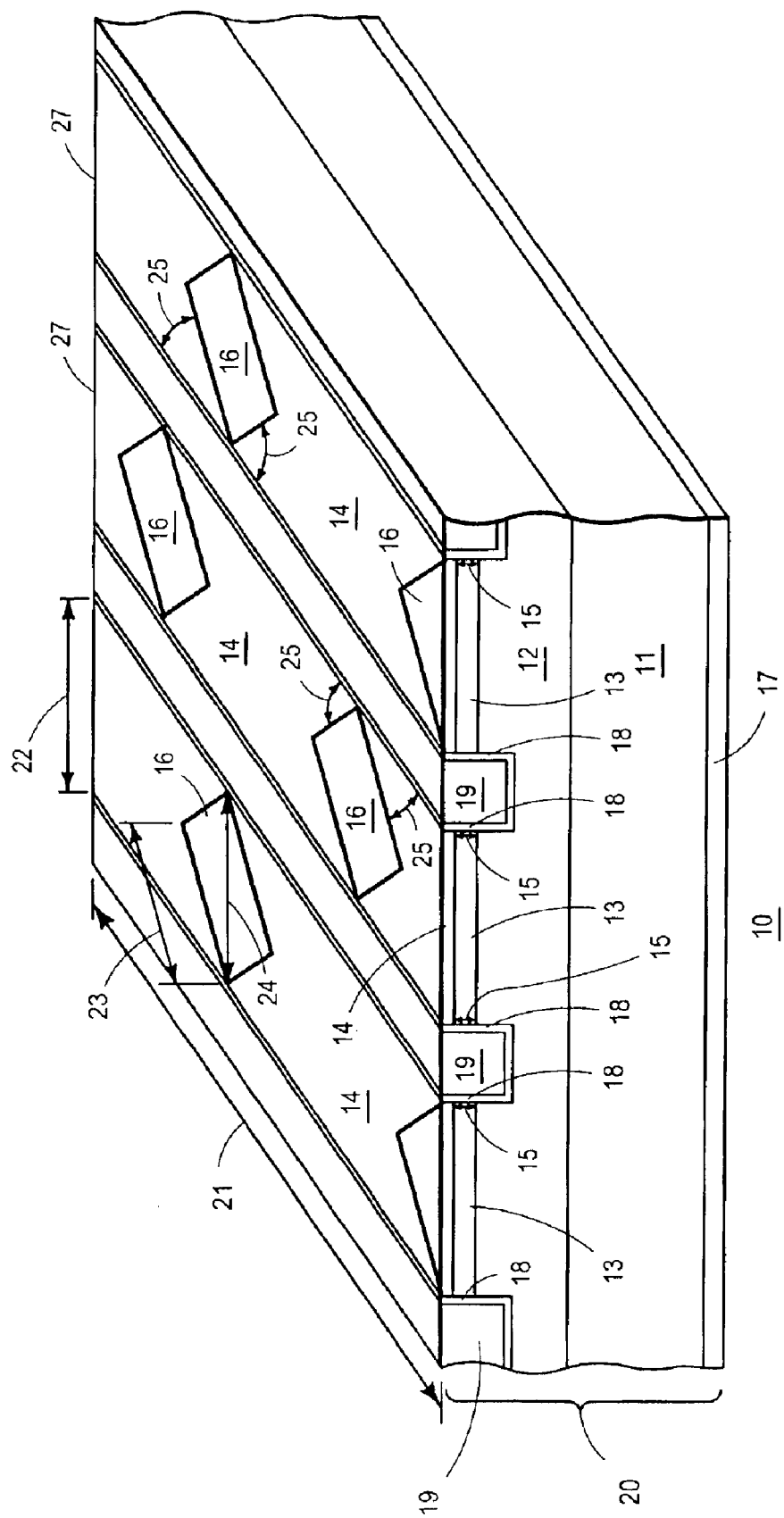
FIG. 4 schematically illustrates a portion of an embodiment of a transistor formed with a plurality of stripe cells in accordance with the present invention.

FIG. 4 schematically illustrates a portion of an embodiment of a transistor 10 that is formed to have a high density, low source resistance, high latch-up immunity, and a low body resistance. Transistor 10 is formed on a semiconductor substrate 20. Typically, a drift region 12 is formed on a base or bulk substrate 11. Drift region 12 is utilized as a conduction path for electron flow through transistor 10. Transistor 10 is formed to have a plurality of transistor stripes 27 that are formed on substrate 20 and traverse across the surface of substrate 20. Each stripe 27 forms a transistor and the plurality of transistor stripes 27 are interconnected (not shown) to form transistor 10. A body region or body 13 is formed in substrate 20 as a long stripe that is a portion of stripe 27. A source region 14 is formed on the surface of substrate 20 and typically is formed as a long stripe overlying body 13. Source region 14 is a portion of stripe 27. A drain contact 17 is formed on a surface of substrate 20 that opposite to the surface on which region 14 is formed. Adjacent to an edge of each source region 14 is a trench gate structure that includes a gate insulator 18 and a gate conductor 19. Thus, each source region 14 is formed between opposing trench gate structures. Trench gate structures are well-known to those skilled in the art. Body 13 typically abuts adjacent gate insulator 18 so that a channel 15, illustrated by an arrow, is formed in body 13 when an appropriate potential is applied to conductor 19. Current flows through channel 15, through drift region 12, to drain contact 17. Source region 14 also typically abuts insulator 18 in order to provide a conduction path for electrons to flow through channel 15. Each source region 14 has a width 21 along stripe 27 and a length 22 between two gate structures. A plurality of body contact regions or body contacts 16 are formed to be positioned along the length of each source region 14. Each contact 16 is formed within region 14 and extends from the surface of substrate 20 through region 14 to electrically contact body 13.

Figure 1:
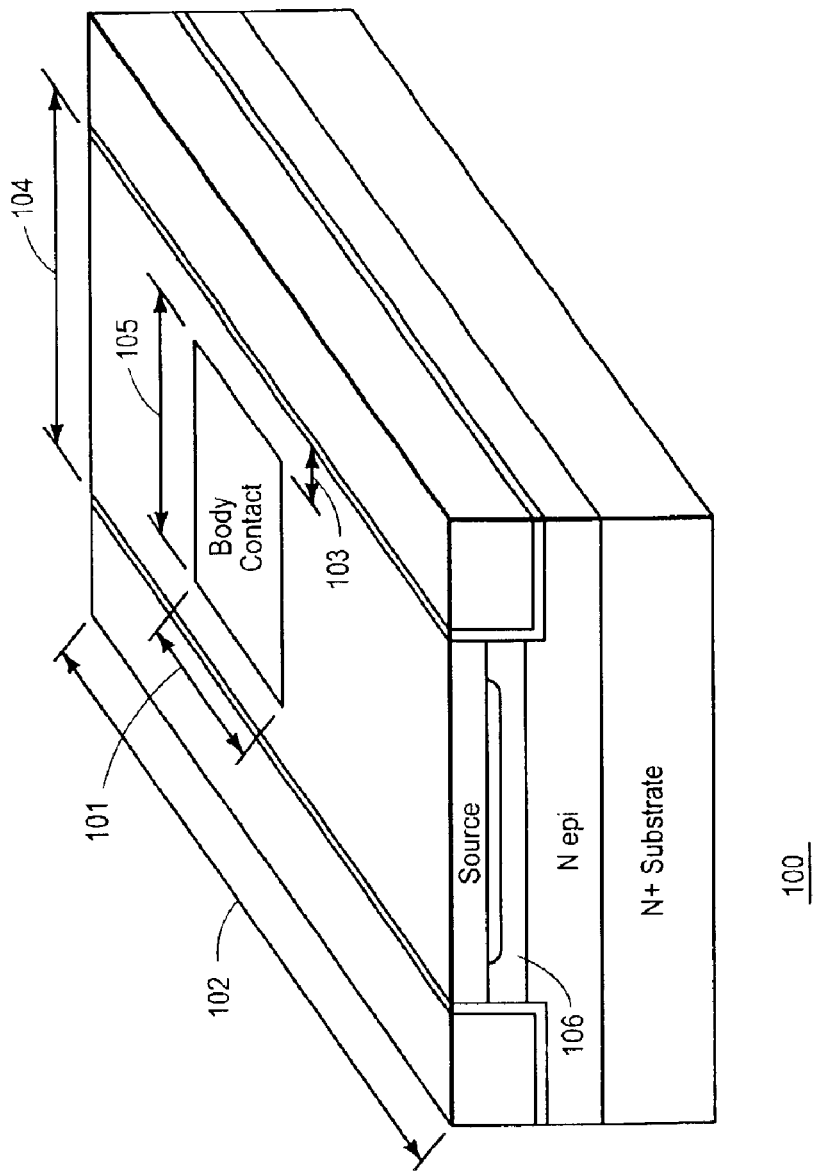
FIG. 1 schematically illustrates a portion of an embodiment of a prior art transistor.
Figure 2:
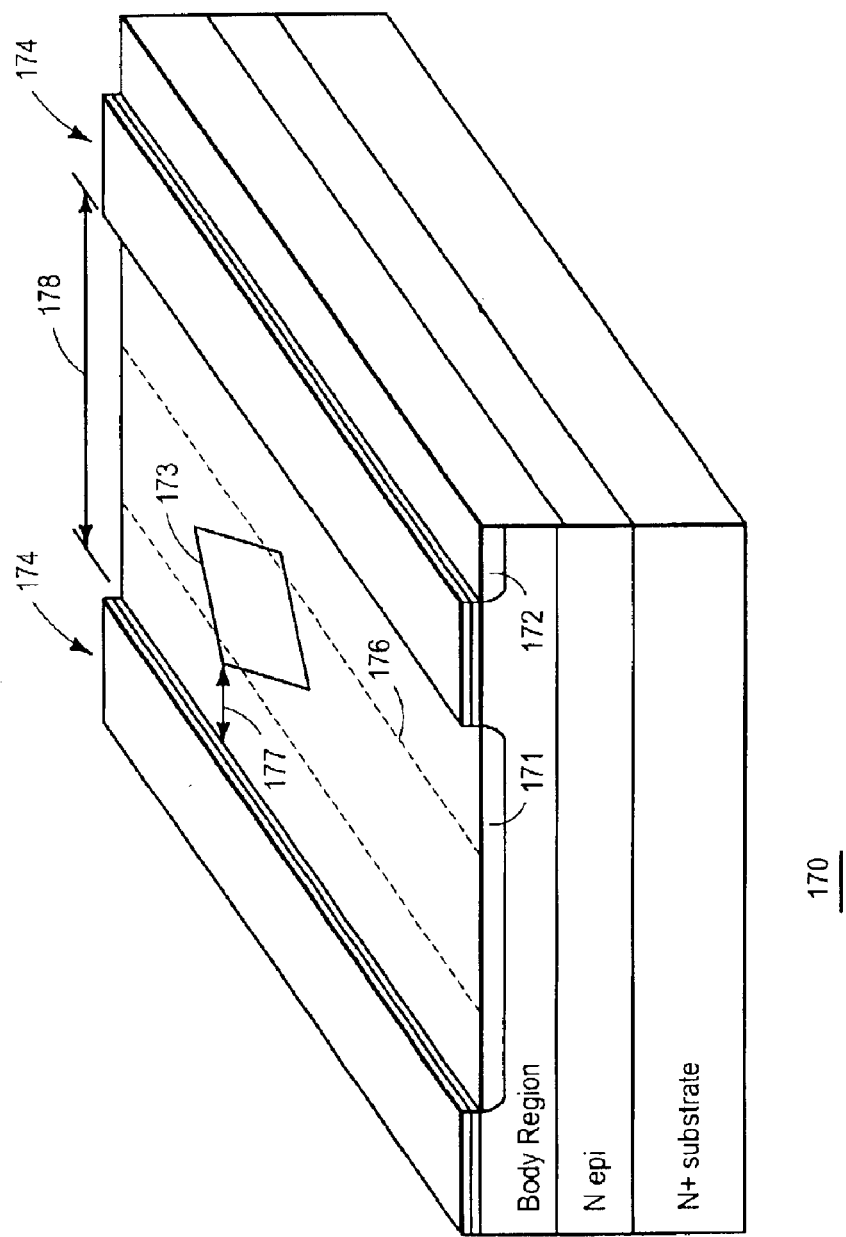
FIG. 2 schematically illustrates a portion of an embodiment of another prior art transistor.
Figure 3:
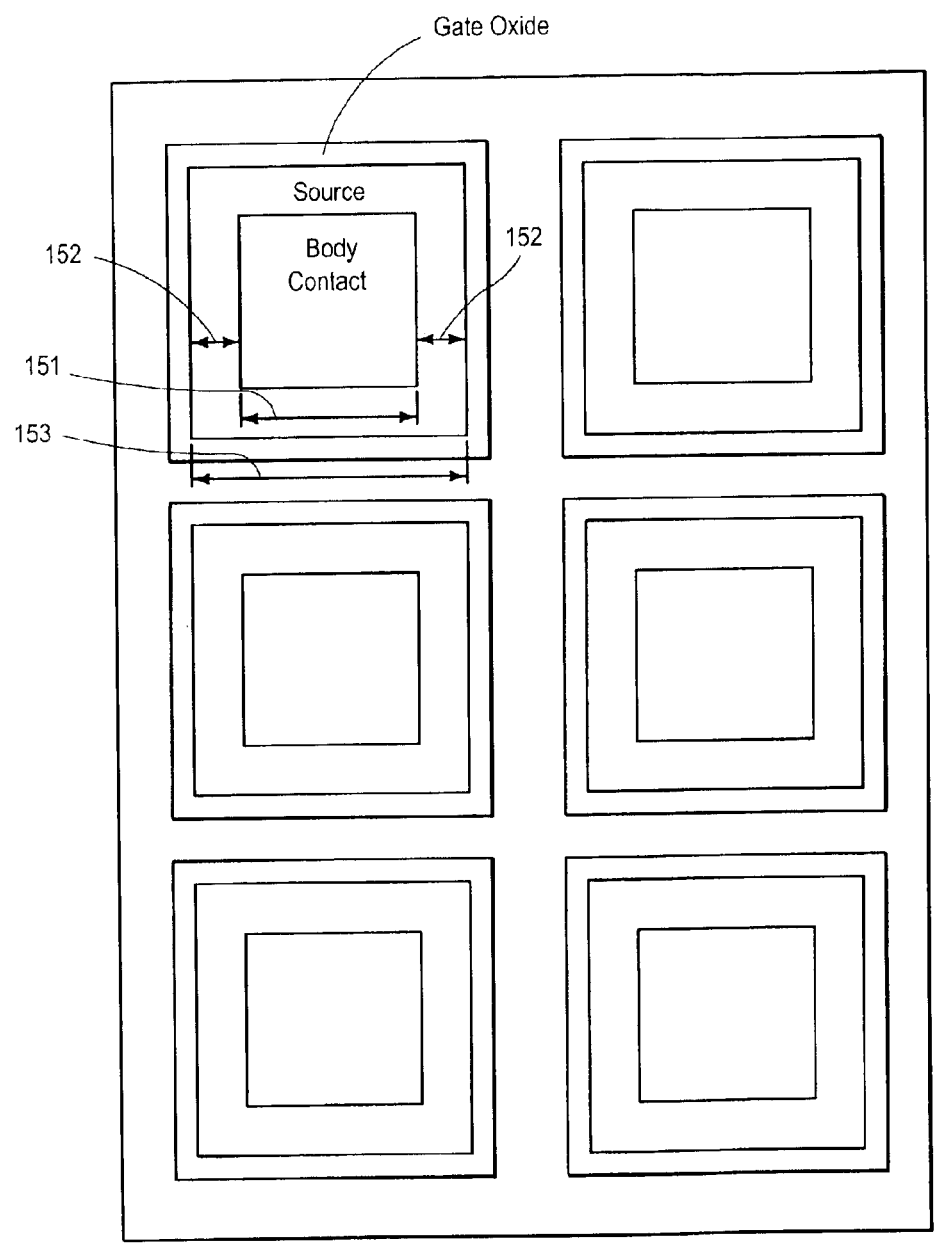
FIG. 3 schematically illustrates a portion of an embodiment of still another prior art transistor.

In the preferred embodiment, transistor 10 is a vertical power MOSFET. Also in this preferred embodiment, each body contact 16 has a diamond shape formed as a square that is turned 45 degrees to the axis of width 21. Typically, two of the apexes of the diamond each touch a side of source region 14 and preferably extend to touch a side of insulator 18. Those of ordinary skill in the art will realize that contact 16 is a doped region and that due to process variations, the edges may vary slightly from those illustrated in FIG. 2. Typically, each contact 16 is positioned within region 14 so that each side of contact 16 has a point contact with an adjacent side of region 14 and preferably insulator 18. Forming contact 16 to contact the sides of region 14 or insulator 18 reduces the body resistance of transistor 10 without decreasing the effective source width or width 21. Thus the body resistance is decreased without increasing the area of transistor 10. Because contact 16 touches the side of region 14, it also touches channel 15, thus, the distance that leakage current must flow through body 13 before reaching one of the plurality of body contacts 16 is reduced. As the distance between contact 16 and channel is reduced, the body resistance is reduced not only by just the reduced distance but also by reducing the spreading effect of the distributed resistance of the body resistance. Typically, the body resistance is reduced by ten to twenty per cent (10% to 20%). The reduced body resistance correspondingly reduces the body voltage and increases latch-up immunity of transistor 10.

Contacts 16 also increase the density of transistor 10. Each side of each contact 16 has a length 23 that is formed to be the minimum resolvable dimension of the photolithography procedures and equipment used for forming transistor 10. Thus, contact 16 has a width 24 across source region 14 that is about 1.414 times the distance of length 23. As a result, the minimum distance of length 22 is about 1.414 times the minimum resolvable dimension as compared to prior art transistors that require about two (2) times the minimum resolvable dimension. Thus, contacts 16 reduce the value of length 22 and correspondingly the area, of each stripe 27 by about thirty per cent (30%).

Additionally, because of this body contact shape, source resistance is decreased as the width of the source edge along the contact area is increased.

In some cases the apex of contact 16 may be projected to extend beyond the edge of insulator 18. In such a case, some portion of the apex will be truncated to form a side of contact 16 that is coincident with the side of region 14 or coincident with the side of insulator 18. It should be noted that when viewed in a horizontal plane, such as the plane of the surface of substrate 20, the sides of contact 16 form an acute angle 25 with the side of either region 14 or insulator 18. Another way to view this relationship is that the acute angle is formed between the sides of contact 16 and a vertical plane that is perpendicular to the surface of substrate 20 along the side of region 14 and passes through the interface between region 14 and insulator 18. In the case where contact 16 intersects region 14 or insulator 18, acute angle 25 is formed at the point of contact. Because of this acute angle, the amount of contact 16 that extends parallel to the side of either region 14 or insulator 18 when such an intersection occurs is small because the wedge shape formed by angle 25 minimizes the lateral intersection between contact 16 and the intersected side. Typically the length of any overlap between contact 16 and the side of either insulator 18 or region 14 as measured along the side of region 14 is less than about one-half of length 23. Such an overlap length still reduces the body resistance of transistor 10.

If the body contact had straight sides parallel to width 21 and these sides of the body contact touch the sides of either the source region or gate insulator, that area forms an inactive area. Consequently, it is preferable for the body contact to form an acute angle with the side of region 14 or insulator 18 and to have a point contact or tangential contact thereto. It should be noted that contacts 16 may be spaced closer together or further apart than illustrated in FIG. 4. For example, contacts 16 may be abutted together so that all the apexes extending down the middle of region 14 touch an adjacent contact 16, or contacts 16 may be staggered and not aligned with contacts 16 in an adjacent source region 14.

A conductor is applied to cover and make electrical contact to the exposed surfaces of regions 14 and contacts 16. As is well-known in the art, such a conductor is insulated from gate conductor 19. The conductor is not shown in FIG. 4 for clarity of the explanation.

Figure 5:
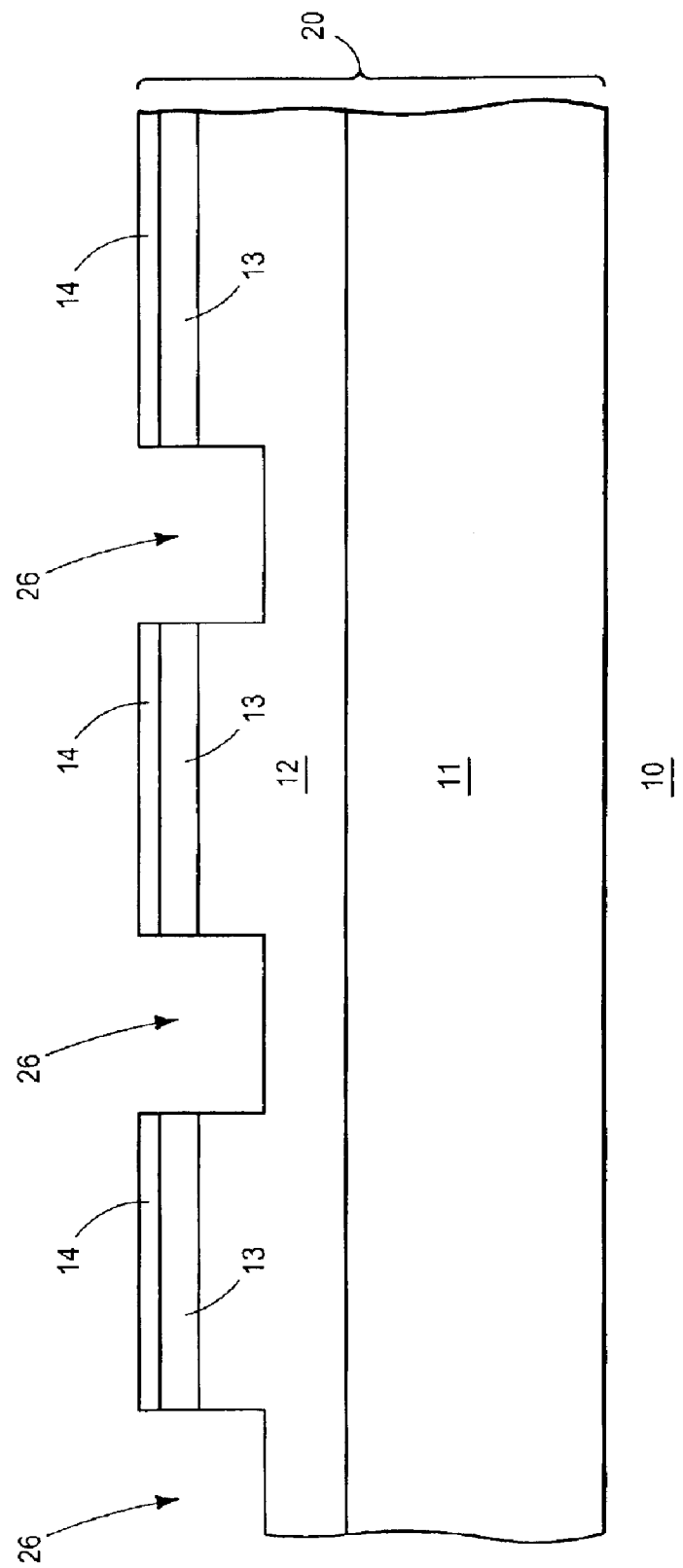
FIG. 5 schematically illustrates some stages in an embodiment of a formation process for the transistor of FIG. 4 in accordance with the present invention.

FIG. 5 schematically illustrates portions of several stages in an embodiment of a manufacturing sequence for transistor 10. Typically, region 12 is formed on a surface of substrate 11. Region 12 may be formed by a variety of well-known methods including epitaxial deposition and ion implantation. In the preferred embodiment, substrate 11 is a heavily doped N-type bulk substrate and region 12 is formed as an N-type epitaxial layer on substrate 11 and has a lower doping concentration than substrate 11. Openings 26 are then formed in region 12. Openings 26 are formed by trench techniques or other techniques that are well-known to those of ordinary skill in the art. Thereafter, insulator 18 is formed on the exposed surfaces of opening 26. In the preferred embodiment, the exposed surfaces of opening 26 are oxidized to form gate insulator 18 from silicon dioxide. Body 13 is formed on a surface of region 12 by one of a variety of well-known methods including diffusion and ion implantation. In the preferred embodiment, body 13 is formed as a lightly doped P-type diffused layer upon region 12. Source region 14 is formed on a surface of body 13 by one of a variety of well-known methods including diffusion and ion implantation. In the preferred embodiment, region 14 is formed as a highly doped N-type diffused layer. Openings 26 are then filled with conductor material to form gate conductor 19. In the preferred embodiment, openings 26 are filled with doped polysilicon.

Referring to FIG. 4 and FIG. 5, contacts 16 are formed extending through region 14 and into body 13 by diffusion, ion implantation, or other techniques that are well-known to those skilled in the art. In the preferred embodiment, contacts 16 are formed as highly doped P-type material by implanting dopants into body 13 and then thermally driving the dopants to extend into body 13 and form electrical contact to body 13.

Figure 6:
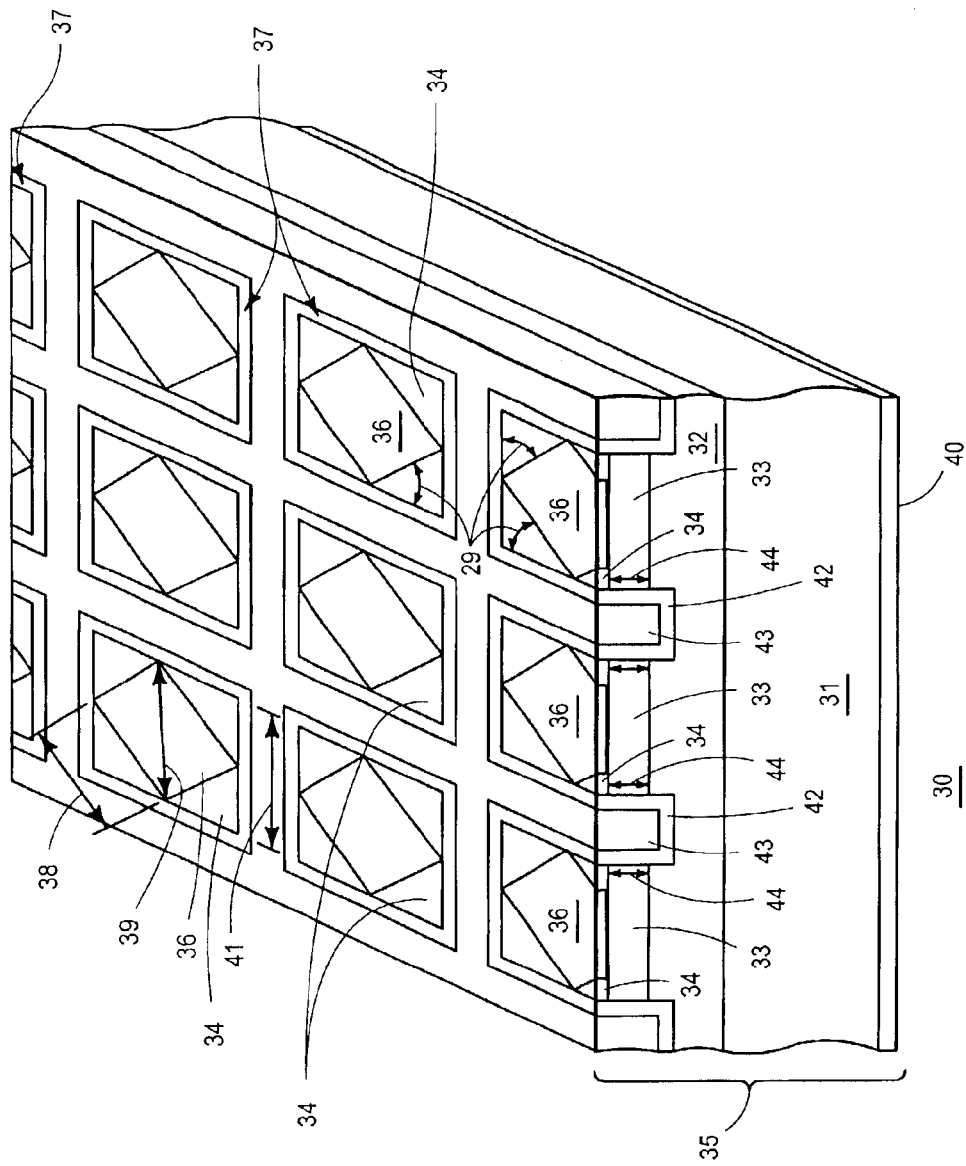
FIG. 6 schematically illustrates a portion of an embodiment of a transistor formed with a plurality of closed cells in accordance with the present invention.

FIG. 6 schematically illustrates a portion of an embodiment of a transistor 30 that is formed from a plurality of square shaped cells or plurality of cells 37. Each cell 37 forms a transistor and each cell 37 is interconnected (not shown) to form transistor 30 from the plurality of cells 37. Transistor 30 is formed on a semiconductor substrate 35. Typically, a drift region 32 is formed on a bulk substrate 31. Drift region 32 is utilized as a conduction path for electron flow through transistor 30. A drain contact 40 is formed on a surface of substrate 35 that is opposite to drift region 32. Each cell 37 includes a body 33 that is formed on drift region 32 and also includes a source region 34 that is formed on body 33. Adjacent to each edge of each source region 34 is a trench gate structure that includes a gate insulator 42 and a gate conductor 43. Such trench gate structures are well-known to those skilled in the art. Body 33 typically abuts adjacent gate insulator 42 so that a channel 44, illustrated by an arrow, may be formed in body 33 when an appropriate potential is applied to conductor 43. Source region 34 overlies body 33 and also abuts insulator 42 in order to provide a source of electrons to flow through channel 44. Each source region 34 has a length 41 and a width that usually is about the same as length 41. A body contact 36 is formed on the surface of substrate 35 and extends through source region 34 to make electrical contact to body 33.

In the preferred embodiment, transistor 30 is a vertical multi-cell power MOSFET. In this preferred embodiment, each body contact 36 has a diamond shape formed as a square that is turned 45 degrees to the sides of region 34 and with the apexes of the diamond touching the sides of region 34 and preferably touching the sides of insulator 42. As explained in the description of FIG. 4, when viewed in a horizontal plane the sides of the diamond shape form an acute angle 29 with the intersected side of either region 34 of insulator 42 or alternately a plane as described in the description of FIG. 4. Angle 29 functions similarly to angle 25 explained in the description of FIG. 4. Forming contact 36 to contact the sides of region 34 or insulator 42 reduces the body resistance of transistor 30 without reducing the width of source region 34. Because contact 36 touches channel 44 or insulator 42, the distance that leakage current must flow through body 33 before reaching one of the plurality of contacts 36 is reduced. As the distance between contact 36 and channel 44 is reduced, the body resistance is reduced not only by just the reduced distance but also by reducing the spreading effect of the distributed resistance of the body resistance. Typically, the body resistance is reduced by about ten to twenty per cent (10% to 20%). The reduced body resistance reduces the body voltage and increases the latch-up immunity of transistor 30.

In some cases the apex of contact 36 may be projected to extend beyond the edge of insulator 42. Because of acute angle 29 between the side of contact 36 and the side of insulator 42, the amount of contact 36 that extends coincident with the side of either region 34 or insulator 42 is small because the wedge shape formed by the acute angle minimizes the lateral intersection. Typically the length of any overlap between contact 36 and the side of either region 34 or insulator 42 as measured along any side of region 34 is less than about one-half of length 38. This overlap length still reduces the body resistance of transistor 30.

Additionally, contact 36 increases the density of transistor 30. Each side of contact 36 has a length 38 that typically is formed to be the minimum resolvable dimension of the photolithography used for forming transistor 30. Consequently, each contact 36 has a width 39 across cell 37 that is 1.414 times length 38. Thus the minimum distance for length 41 is approximately equal to width 39 or about 1.414 times the minimum dimension that can be formed by the photolithography techniques used to form transistor 30. The resulting area of each region 34 is about two (2) times the minimum resolvable dimension or about fifty percent (50%) less than prior art closed cell transistors.

Also, because of this body contact shape, source resistance is decreased as the width of the source edge along the contact area is increased.

Positioning contact 36 within region 34 so that the apexes of contact 36 touch the sides of either region 34 or insulator 42 ensures that substantially the entire length of each side of region 34 can support current flow through each cell 37. When an appropriate potential is applied to gate conductor 43, channel 44 is formed in the portion of body 33 that abuts insulator 42. Current flows from region 34 through channel 44 then through region 32 and substrate 31 to drain contact 40. Because the sides of contact 36 do not extend along the sides of source region 34 or along the sides of insulator 42, the entire length of each side of region 34 adjacent to insulator 42 is available for current flow.

In other embodiments, the length and width of each cell 37 may be different so that the shape is something other than a square. In such an embodiment, contact 36 will also have a different shape but still have apexes that touch the side of region 34 and channel 44. For example cell 37 may be a rectangle and contact 36 would also be a rectangle that is rotated 45 degrees to the sides of the source region. As described hereinbefore, in other embodiments the body contact may have different shapes. It is preferable for the body contact to form an acute angle with and have a point contact or tangential contact to either the source region or gate insulator. As will be understood by those of ordinary skill in the art, transistor 30 may be formed using techniques similar to those used to form transistor 10 that is explained in the description of FIG. 5. The formation of the trench structures and cells may utilize different masking patterns to form the patterns of cells 37.

Figure 7:
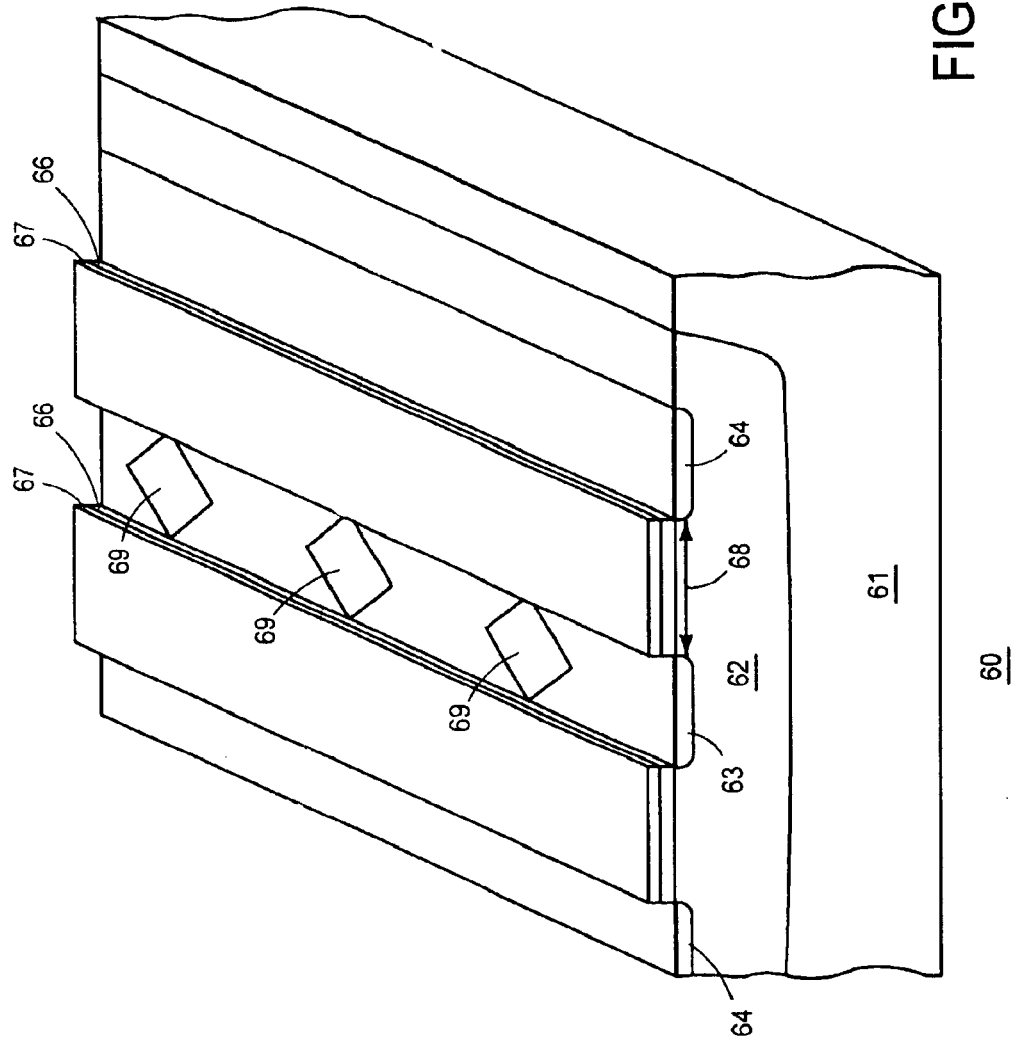
FIG. 7 schematically illustrates a portion of an embodiment of another transistor in accordance with the present invention.

FIG. 7 schematically illustrates a portion of an embodiment of a lateral transistor 60 that is formed to have high density, low source resistance, high latch-up immunity, and a low body resistance. Transistor 60 is formed on a semiconductor substrate 61 that is similar to substrate 20 (FIG. 4). A body 62 functions similarly to body 13 explained in the description of FIG. 4. A source region 63 and a drain region 64 are formed on the surface of substrate 61 and extend into body 62. A gate structure is interposed between regions 63 and 64 and includes a gate insulator 66 and a gate conductor 67 formed on insulator 66. Body contacts 69 are formed in source region 63 and extend through region 63 to electrically contact body 62. Body contacts 69 are similar to contacts 16 explained in the description of FIG. 4 and are positioned in a similar configuration to contacts 16.

Figure 8:
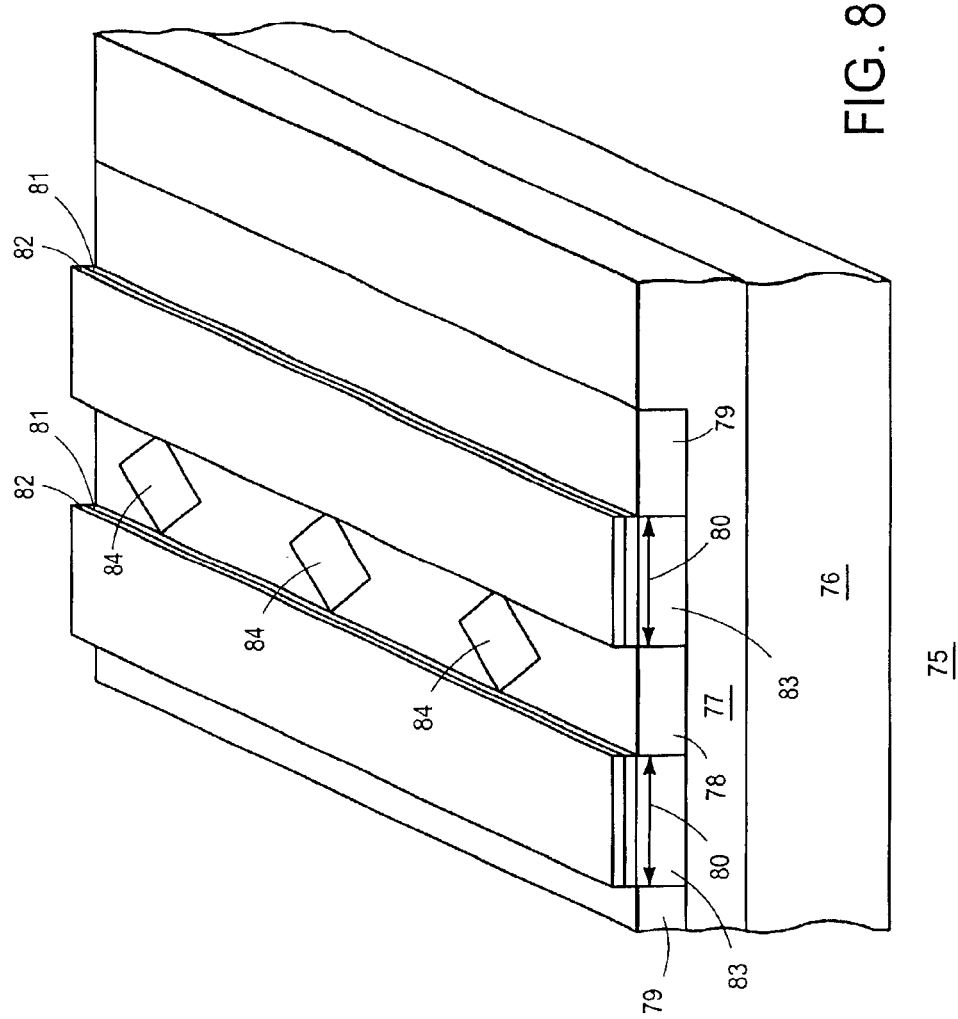
FIG. 8 schematically illustrates a portion of an embodiment of a silicon-on-insulator transistor in accordance with the present invention.

FIG. 8 schematically illustrates a portion of an embodiment of a silicon-on-insulator (SOI) transistor 75 that is formed to have high density, low source resistance, high latch-up immunity, and a low body resistance. Transistor 75 is formed on a semiconductor substrate 76 that is similar to substrate 20 (FIG. 4). An insulator 77 is formed on substrate 76 in order to isolate substrate 76 from other elements of transistor 75. A source region 78 and a drain region 79 are formed on the surface of insulator 77. A body 83 is formed between source region 78 and drain region 79. During operation, a channel 80 is formed in body 83. A gate structure is interposed between regions 78 and 79 and includes a gate insulator 81 and a gate conductor 82 formed on insulator 81. Body contacts 84 are formed in source region 78 and extend to electrically contact body 83. Body contacts 84 are similar to contacts 16 explained in the description of FIG. 4 and are positioned in a similar configuration to contacts 16. As can be seen, body contacts 84 provide good electrical contact to body 84 without creating large inactive areas.

Body contacts 16, 36, 69, and 84 may have other shapes in addition to a diamond shape including other polygons. For the case of other polygons, some of the sides of the polygon should touch and form an acute angle with the sides of the source region or the sides of the gate insulator as described hereinbefore for the diamond shape. Preferably these sides of the polygon form point contact to the sides of the source region or the gate insulator.

Figure 9:
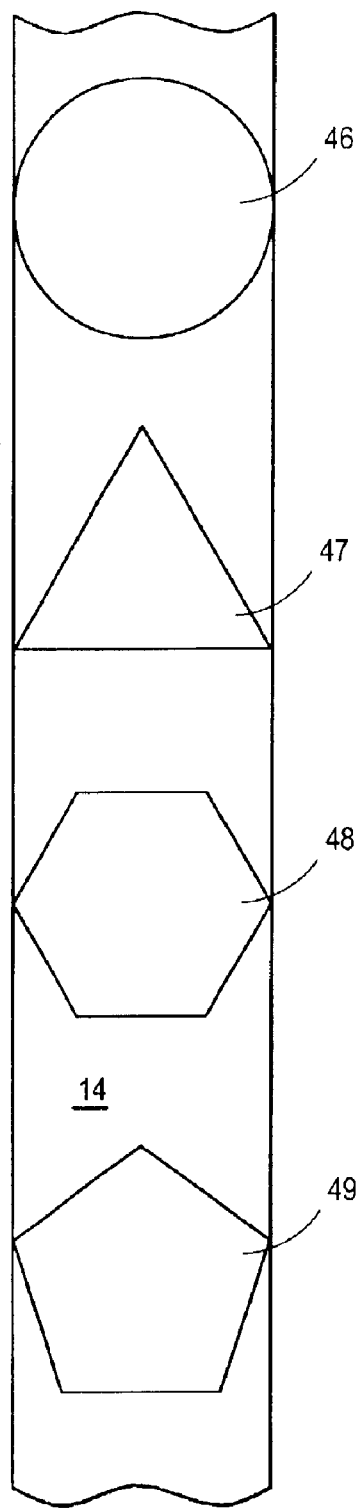
FIG. 9 schematically illustrates alternate embodiments of portions of the transistors shown in FIG. 4 and FIG. 7 in accordance with the present invention.

FIG. 9 schematically illustrates some different geometries that may be used for forming body contacts 16 and 69 that are described hereinbefore. Body contact 16 or 69 may be formed as a circle contact 46. Body contact 46 could be formed to be tangential to a side of source region 14 or source region 63 or to the associated gate insulator. Body contact 16 or 69 may be formed as a triangle contact 47. Body contact 47 could be formed so that two of the apexes of the triangle touch a side of source region 14 or a side of region 63 or to the associated gate insulator. Similarly, body contact 16 or 69 may be formed as a hexagon contact 48 or a pentagon contact 49. Body contact 48 or 49 could be formed so that two of the apexes of the hexagon or pentagon touch a side of source region 14 or a side of region 63 or to the associated gate insulator.

Figure 10:
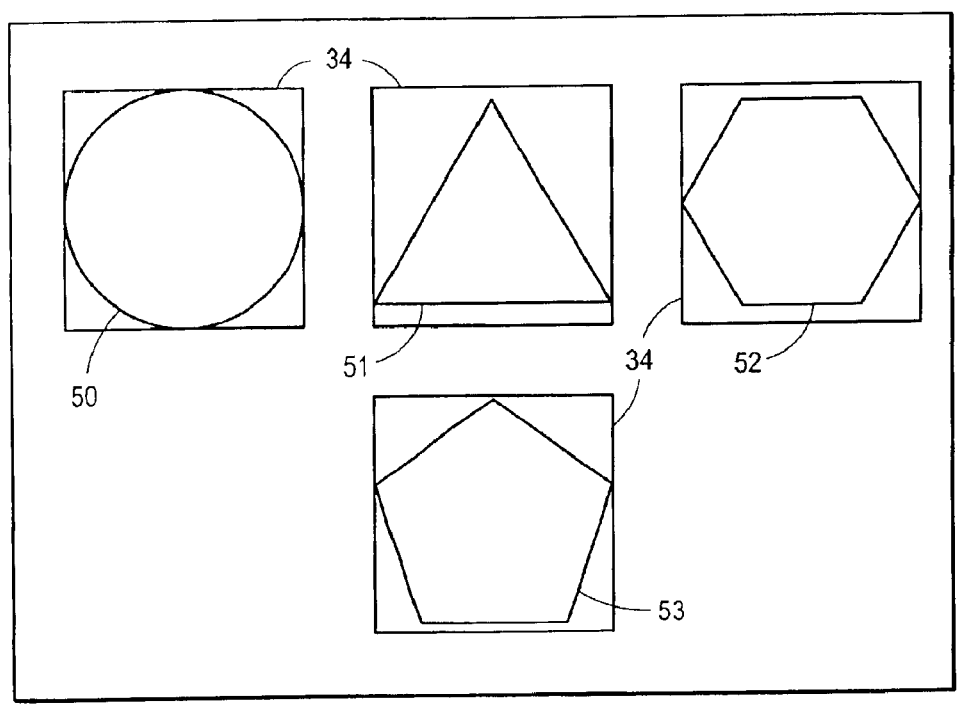
FIG. 10 schematically illustrates alternate embodiments of portions of the transistor shown in FIG. 6 in accordance with the present invention.

FIG. 10 schematically illustrates some different geometries that may be used for forming body contacts 36 that are described hereinbefore. Body contact 36 may be formed as a circle contact 50. Body contact 50 could be formed to be tangential to a side of region 34 or to the associated gate insulator. Body contact 36 may be formed as a triangle contact 51. Body contact 51 could be formed so that the apexes of the triangle touch a side of region 34 or to the associated gate insulator as long as no side of the triangle coincides with a side of region 34 or to the associated gate insulator. Similarly, body contact 36 may be formed as a hexagon contact 52 or a pentagon contact 53.

In view of all of the above, it is evident that a novel device and method is disclosed. Included, among other features, is positioning a body contact to have sides that touch the sides of a source region and preferably having a point contact with the sides of the source region or to the associated gate insulator. Such a configuration increases the density of the semiconductor devices and reduces the on-resistance.

While the invention is described with specific preferred embodiments, it is evident that many alternatives and variations will be apparent to those skilled in the semiconductor arts. More specifically the invention has been described for particular multi-cell N-channel MOS transistor structures and a lateral structure, although the method is directly applicable to other transistors and structures. For example, the method is applicable to single cell transistor structures as well as to P-channel MOS transistors and BiCMOS, silicon-on-insulator (SOI) transistors, metal semiconductor FETs (MESFETs), HFETs, and other transistor structures.

What is claimed is:

1. A method of forming a semiconductor device comprising:
   providing a substrate having a surface;
   forming a source region of a transistor on at least a portion of the surface of the substrate and extending into the substrate including forming the source region to have a plurality of sides; and
   positioning a body contact having a shape that is one of a hexagon, a pentagon, a diamond, a triangle, or a circle within the source region so that a side of the body contact touches a side of the source region and forms an acute angle with the side of the source region wherein the acute angle is in a plane parallel to the surface of the substrate.

2. The method of claim 1 wherein positioning the body contact includes positioning the body contact to touch a side of a gate insulator and wherein the side of the source region is parallel to an edge of the gate insulator.

3. The method of claim 1 wherein positioning the body contact having the shape that is one of a hexagon, a pentagon, a diamond, a triangle, or a circle within the source region includes positioning the body contact that is one of a hexagon, a pentagon, diamond, or a triangle so that an apex of the body contact approximately touches the side of the source region.

4. A method of forming a semiconductor device comprising:
   providing a substrate having a surface;
   forming a source region of a transistor on at least a portion of the surface of the substrate and extending into the substrate including forming the source region to have a plurality of sides; and
   positioning a diamond shaped body contact within the source region so that an apex of the diamond shaped body contact touches a side of the source region and forms an acute angle with the side of the source region wherein the acute angle is in a plane parallel to the surface of the substrate.

5. The method of claim 4 wherein positioning the diamond shaped body contact within the source region so that the apex of the diamond shaped body contact touches the side of the source region and forms the acute angle includes positioning the diamond shaped body contact so that the apex has point contact with the side of the source region.

6. The method of claim 4 wherein positioning the diamond shaped body contact within the source region includes positioning a plurality of diamond shaped body contacts.

7. The method of claim 4 wherein forming the source region of the transistor includes forming the source region as a stripe having a plurality of diamond shaped body contacts.

8. The method of claim 4 wherein forming the source region of the transistor includes forming the source region as a plurality of closed cells.

9. The method of claim 4 wherein forming the source region of the transistor includes forming the source region overlying a body of the transistor and also includes forming the body on a drift region of the transistor.

10. The method of claim 4 wherein forming the source region of the transistor includes forming the source region adjacent to opposing gate sections.

11. The method of claim 4 further including forming the substrate and the source region of a first conductivity type and forming the body contact of a second conductivity type that is opposite to the first conductivity type.

12. A semiconductor device comprising:
a substrate having a surface;
a body region in the substrate;
a source region abutting the body region, the source region having sides; and
a body contact having a shape that is one of a hexagon, a pentagon, a diamond, a triangle, or circle, the body contact extending through the source region and making electrical contact with the body region, the body contact having sides that contact a side of the source region and form an acute angle at a point of contact wherein the acute angle is in a plane that is parallel to the surface of the substrate.

13. A semiconductor device comprising:
a substrate having a surface;
a body region in the substrate;
a source region abutting the body region, the source region having sides; and
a body contact having a diamond shape and extending through the source region and making electrical contact with the body region, the body contact having apexes that touch at least two sides of the source region and form an acute angle at a point of contact wherein the acute angle is in a plane that is parallel to the surface of the substrate.

14. The semiconductor device of claim 13 wherein the semiconductor device is a lateral transistor.

15. The semiconductor device of claim 13 wherein the semiconductor device is a vertical transistor.

16. The semiconductor device of claim 13 wherein the source region is positioned between opposing trench gate structures.

17. The semiconductor device of claim 13 wherein the body contact having the diamond shape includes the body contact having sides that contact a gate insulator, the side of the source region being parallel to an edge of the gate insulator.

18. The semiconductor device of claim 13 wherein the source region abutting the body region includes the source region overlying the body region.

19. The semiconductor device of claim 13 wherein the source region abutting the body region includes a plurality of source regions having a square shape.

* * * * *